(12) United States Patent
Kim et al.

(10) Patent No.: US 7,682,965 B2
(45) Date of Patent: Mar. 23, 2010

(54) METHOD FOR MANUFACTURING SEMICONDUCTOR DEVICE

(75) Inventors: Sang Chul Kim, Busan (KR); Han Choon Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 637 days.

(21) Appl. No.: 11/604,921

(22) Filed: Nov. 27, 2006

(65) Prior Publication Data

US 2007/0141833 A1 Jun. 21, 2007

(30) Foreign Application Priority Data

Dec. 20, 2005 (KR) ........................ 10-2005-0126150

(51) Int. Cl.
*H01L 21/4763* (2006.01)
(52) U.S. Cl. .............................. 438/637; 257/E23.145
(58) Field of Classification Search .................. 438/637; 257/E23.145
See application file for complete search history.

(56) References Cited

U.S. PATENT DOCUMENTS

| | | | |
|---|---|---|---|
| 5,935,334 A * | 8/1999 | Fong et al. | 118/723 ME |
| 7,232,763 B2 * | 6/2007 | Omura et al. | 438/700 |
| 2002/0162736 A1 * | 11/2002 | Ngo et al. | 204/192.12 |
| 2005/0212137 A1 * | 9/2005 | Yamamoto et al. | 257/758 |
| 2006/0040490 A1 * | 2/2006 | Chen et al. | 438/629 |
| 2006/0202343 A1 * | 9/2006 | Huang et al. | 257/758 |
| 2006/0216930 A1 * | 9/2006 | Feng et al. | 438/637 |
| 2007/0018329 A1 * | 1/2007 | Oh et al. | 257/762 |
| 2007/0093048 A1 * | 4/2007 | Shim | 438/597 |
| 2007/0249164 A1 * | 10/2007 | Chen et al. | 438/638 |
| 2008/0081464 A1 * | 4/2008 | Matsuda et al. | 438/660 |
| 2008/0124919 A1 * | 5/2008 | Huang et al. | 438/643 |

* cited by examiner

*Primary Examiner*—Thao P. Le
(74) *Attorney, Agent, or Firm*—The Law Offices of Andrew D. Fortney; Andrew D. Fortney; Duangkamol Kay Strohl

(57) ABSTRACT

Provided is a method for manufacturing a semiconductor device. An insulation layer is formed on a bottom structure of a semiconductor substrate. Then, a trench and a via hole are formed by selectively etching the insulation layer, and a copper layer is deposited to fill the via hole and the trench. Next, a copper line is formed by a CMP (chemical mechanical polishing) process to planarize the copper layer, and a plasma process is performed to form a plasma-treated surface layer of the semiconductor substrate. The plasma-treated surface layer is then removed.

18 Claims, 3 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device.

2. Description of the Related Art

When copper is applied as a metal line of a semiconductor device, a dual damascene process is generally performed to form a trench and a via hole in a line shape.

FIG. 1 is a sectional view illustrating a method for manufacturing a copper line according to a related art.

Referring to FIG. 1, an insulation layer 12 is formed on a bottom structure 11 where a predetermined process has been performed. Then, the insulation layer 12 is etched by performing a dual damascene process to form a dual damascene pattern 13.

Next, a copper line 14 is formed using electroplating etc. until the dual damascene pattern 13 is filled.

Next, a chemical mechanical polishing (CMP) process is performed to planarize and/or separate adjacent copper line layers 14.

The above process is called a Cu CMP process. After the Cu CMP process, a cleaning process is performed to remove floating or extraneous matter and slurry generated during the CMP process.

However, according to a related art, copper corrosion 15 may form on the copper line layer 14 by photo corrosion or galvanic corrosion after cleaning, or copper remainder 16 may remain on the surface of a wafer after cleaning.

When an intermetal dielectric (IMD) layer is deposited without removing the copper corrosion 15 or the copper remainder 16, adhesion of the subsequently deposited IMD may be weakened. Additionally, copper atoms in the copper remainder 16 may diffuse into the IMD layer, thereby increasing the possibility of causing a short between the copper line layers 14.

Accordingly, the related art process may require an additional cleaning process to remove particles that may not be removed during the cleaning process or that may be generated after the cleaning process. If the IMD layer is deposited when the particles remain, copper may diffuse between the dielectric layers due to an insufficient adhesion.

Especially, because it is difficult to remove certain copper residue such as the copper corrosion generated by photo corrosion or galvanic corrosion and the copper remainder caused by an uneven wafer surface in the related art process, a new cleaning process is in demand.

SUMMARY OF THE INVENTION

Accordingly, the present invention is directed to a method for manufacturing a semiconductor device that substantially obviates one or more problems due to limitations and disadvantages of the related art.

An object of the present invention is to provide a method for manufacturing a semiconductor device that can remove copper remainders and copper corrosion, which may not be removed by a cleaning process after a copper CMP process or that may be generated during or after the cleaning process.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, there is provided a method for manufacturing a semiconductor device, the method including: forming an insulation layer on a bottom structure of a semiconductor substrate (on which a predetermined process may have been performed); forming a trench and a via hole by selectively etching the insulation layer; forming a copper layer on an entire surface of the semiconductor substrate until the via hole and the trench are filled; planarizing the copper layer by a CMP (chemical mechanical polishing) process to form a copper line filling the via hole and the trench; performing a plasma process to form a plasma-treated surface layer of the semiconductor substrate having the copper line thereon; and removing the plasma-treated surface layer.

In another aspect of the present invention, there is provided an a method for a semiconductor device, the method including: forming an insulation layer on a bottom structure of a semiconductor substrate (on which a predetermined process may have been performed); forming a trench and a via hole by selectively etching the insulation layer; forming a copper layer on an entire surface of the semiconductor substrate until the via hole and the trench are filled; planarizing the copper layer by a CMP (chemical mechanical polishing) process to form a copper line filling the via hole and the trench; amorphizing a surface layer of the semiconductor substrate having the copper line thereon; performing a plasma process to form a plasma-treated, amorphous surface layer; and removing the plasma-treated, amorphous surface layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings.

It will also be understood that when a layer is referred to as being "on" another layer or substrate, it can be directly on the other layer or substrate, or intervening layers may also be present.

In embodiments of the present invention, a method for manufacturing a trench and a via hole includes a trench first dual damascene process comprising forming the trench first and then the via hole, and a via first dual damascene process comprising forming the via hole first and then the trench. Additionally, the method includes a single damascene process. The single damascene process comprises forming a via hole in an insulator layer, forming a via plug in the via hole, forming a second insulator layer thereon, and then forming the trench therein to form a metal line.

First Embodiment

Figure 1:
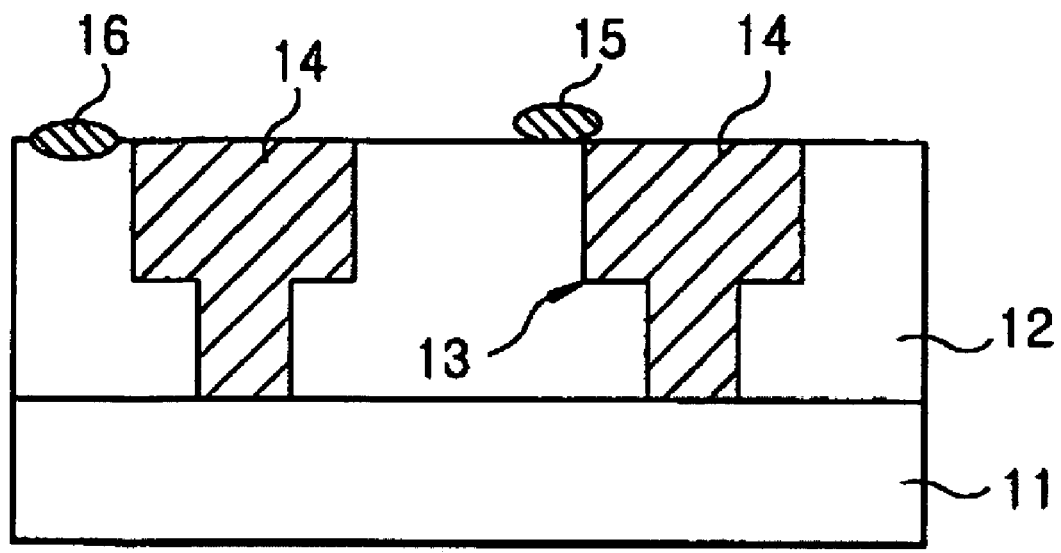
FIG. 1 is a sectional view illustrating a method for manufacturing a copper line according to a related art.
Figure 2:
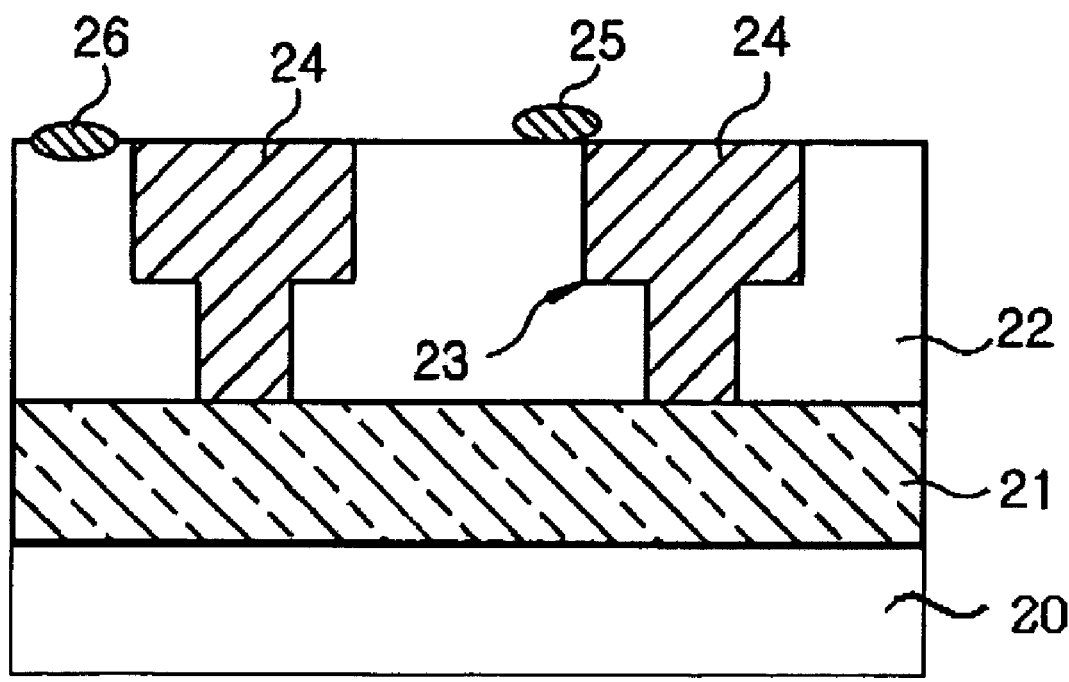
FIGS. 2 to 5 are sectional views illustrating a method for manufacturing a semiconductor device according to a first embodiment of the present invention.
Figure 3:
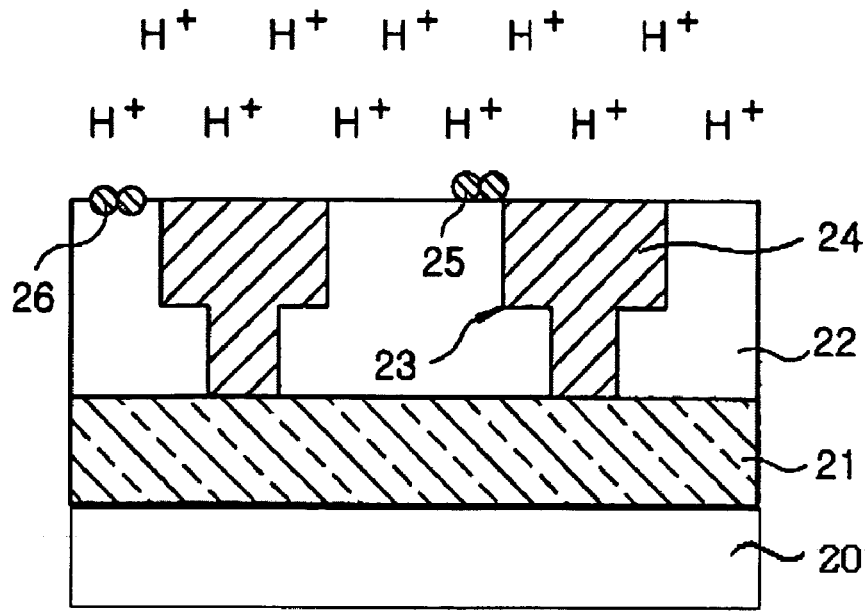
Figure 4:
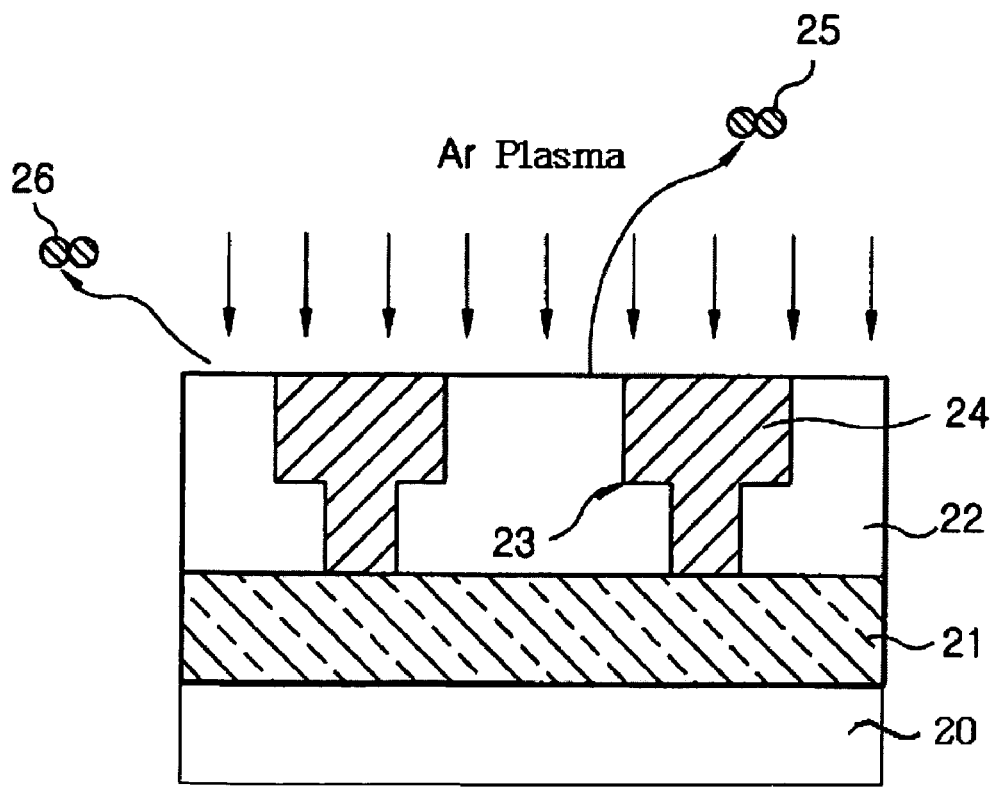

FIGS. 2 to 4 are sectional views illustrating a method for manufacturing a semiconductor device according to a first embodiment of the present.

As illustrated in FIG. 2, an insulation layer 22 is formed on a bottom structure 21 of a semiconductor substrate 20 in which a predetermined process has been completed. The bottom structure 21 may comprise, for example, a metal or polysilicon line. Thus, the predetermined process may comprise forming the metal or polysilicon line, cleaning the substrate 20 with the metal or polysilicon line thereon, etc. A via hole and a trench are formed on the insulation layer 22.

In this embodiment of the present invention, a method for manufacturing the trench and the via hole includes a trench first dual damascene process comprising forming the trench first and then the via hole, and a via first dual damascene process comprising forming the via hole first and then the trench.

Additionally, the method includes a single damascene process. The single damascene process forms a via plug in a via hole, then a trench in a subsequently deposited insulator layer to form a metal line.

In the first embodiment of the present invention, a method for manufacturing a dual damascene pattern 23 using a dual damascene process will be described.

Next, a copper line layer 24 is formed by electroplating until the dual damascene pattern 23 is filled. The electroplating is generally preceded by deposition (e.g., by chemical vapor deposition [CVD], atomic layer deposition [ALD], or a physical vapor deposition [PVD] technique such as sputtering) of an adhesion promoter such as Ti or Ta, deposition (by CVD or ALD) of a diffusion barrier such as TiN or TaN, and/or deposition (e.g., by CVD, ALD, or PVD) of a seed layer such as Cu for the subsequent electroplating step. In one embodiment, electroplating is preceded by sequential deposition of an adhesion promoter, a diffusion barrier, and a seed layer.

Then, a chemical mechanical polishing (CMP) process is performed to planarize the electroplated Cu layer and separate (electrically and/or physically) adjacent copper line layers 24.

The above process is called a Cu CMP process. After the Cu CMP process, a cleaning process is performed to remove floating matter (e.g., unremoved copper residue or copper corrosion products such as copper oxide[s]) and/or adhered slurry particles that may not have been successfully removed during or after the CMP process.

However, copper corrosion 25 may be formed on the copper line layer 24 by photo (e.g., light-induced) corrosion or galvanic corrosion after cleaning, or copper remainder/residue 26 on the surface of the insulation layer 22 may remain after Cu CMP and cleaning.

A process for removing copper residue such as the copper residue 26 and the copper corrosion 25 on the semiconductor substrate 20 may be performed as follows.

As illustrated in FIG. 3, to remove the copper residue after the copper line and cleaning processes, $SiH_4$ or $NH_3$ gas is decomposed by an Ar remote plasma (e.g., a plasma not in direct contact with the substrate, formed from a gas comprising Ar as a main constituent, rather than as a trace constituent) to create or generate $H^+$ ions and/or H. radicals, which then react with the surface of the semiconductor substrate 20.

That is, $H^+$ ions and/or H. radicals react with the surface of the insulation layer 22 and the surface of the copper line 24 having the copper residue and/or copper corrosion products thereon. Such reaction is believed to weaken cohesion of the surface and/or adhesion of a surface layer (e.g., a plasma-treated surface layer) of the semiconductor substrate 20.

Since the copper residue such as the copper corrosion 25 and the copper remainder 26 may comprise a combination of copper and oxygen, $Cu_2^+$ and $H_2O$ may be generated when the copper residue reacts with $H^+$ ions and/or H. radicals, thereby weakening cohesion.

For example, in the first embodiment of the present invention, $SiH_4$ or $NH_3$ gas is ionized using an Ar plasma to generate $H^+$ ions at a voltage of 100 to 1000 eV for a period of time of 1 to 2 min, thereby effectively weakening a surface layer of the semiconductor substrate 20.

When the voltage is less than 100 eV or the time is less than 1 min, the surface layer of the semiconductor substrate 20 may not be sufficiently weakened. Additionally, when the voltage is more than 1000 eV or the time is more than 2 min, transistors (not shown) and the bottom structure 21 may deteriorate or become damaged.

Next, as illustrated in FIG. 4, a radio frequency (RF) pre-clean process using an Ar plasma (e.g., a plasma formed from a gas comprising Ar as a main constituent, rather than as a trace constituent) is performed to remove the plasma-treated surface layer of the semiconductor substrate 20, thereby removing the copper remainder 26 and the copper corrosion 25 without damaging the semiconductor substrate 20.

For example, in the first embodiment, Ge ions may be generated using an Ar plasma at a voltage of 1000 to 4000 eV for a length of time of 1 to 2 min, thereby removing the copper remainder 26 and the copper corrosion 25 without damaging the semiconductor substrate 20.

When the voltage is less than 1000 eV or the time is less than 1 min, the surface layer of the semiconductor substrate 20 may not be sufficiently removed. Moreover, when the voltage is more than 4000 eV or the time is more than 2 min, the surface layer of the semiconductor substrate 20 may be excessively removed, thereby increasing the likelihood of damaging the bottom structure 21 and/or the semiconductor substrate 20 to an unacceptably high level.

Figure 5:
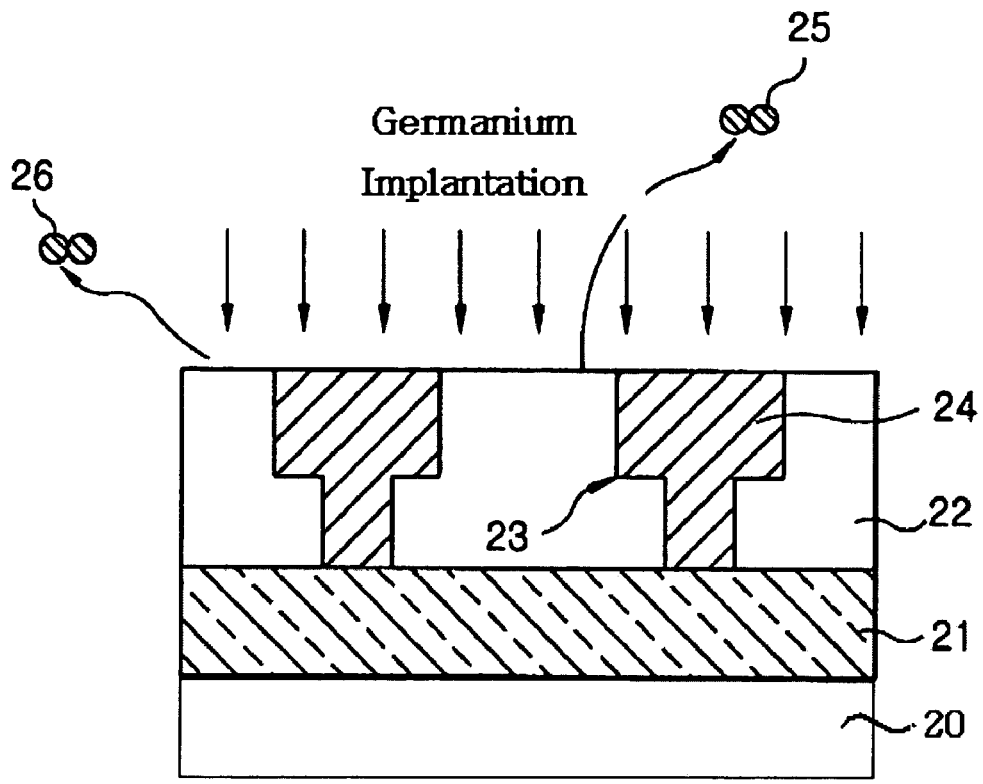

Additionally, FIG. 5 is a sectional view illustrating another method for removing the surface of the semiconductor substrate 20. In another method, Ge may be implanted into the surface of the semiconductor substrate 20 to facilitate removal of the copper residue.

According to the first embodiment of the present invention, the copper remainder 26 and the copper corrosion 25, which is generated by or which is not be removed by a cleaning process after a copper CMP process, may be removed using a plasma process or ion implantation. For example, Ge ions for implantation may be generated from flowing a germane gas (e.g., $GeH_3$, $Ge_2H_6$, etc.) into a plasma, thereby creating Ge-containing ions (e.g., $GeH_2^+$) and/or other ions and radicals (e.g., $H^+$ ions and/or H. radicals). As a result, similar surface reactions may take place under the conditions of Ge ion implantation as described above for $SiH_4$ or $NH_3$ gas in an Ar remote plasma. Consequently, adhesion of a subsequently deposited upper insulation layer improves, and a short circuit that may occur between copper lines 24 by unremoved copper residue can be prevented.

Second Embodiment

Figure 6:
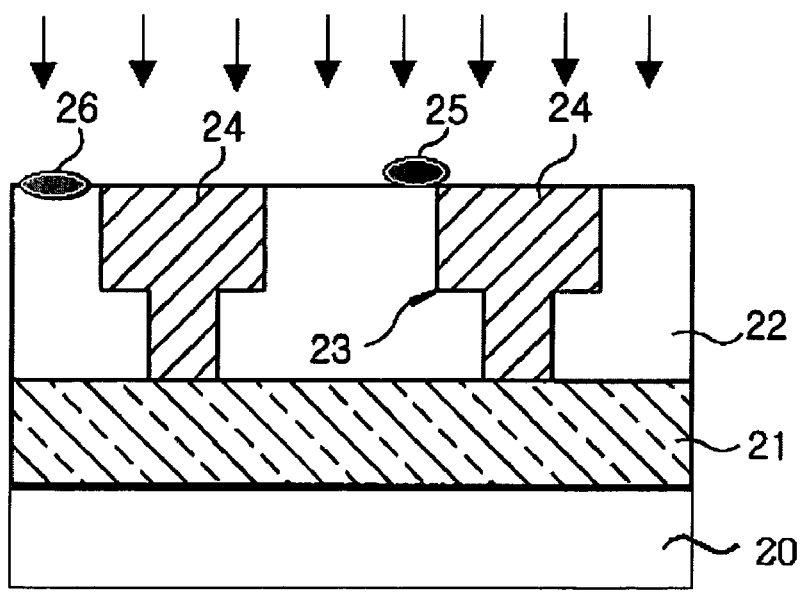
FIG. 6 is a sectional view illustrating a method for manufacturing a semiconductor device according to a second embodiment of the present invention.

FIG. 6 is a sectional view illustrating a method for manufacturing a semiconductor device according to a second embodiment of the present.

The method of the second embodiment is similar to the method of the first embodiment. However, the method of the second embodiment further includes amorphizing the surface layer (e.g., reducing the crystallinity) of the semiconductor substrate 20. This step results in generation of an amorphous surface layer, generally in Cu line 24. The insulator layer 22 will, in many or most cases, be substantially amorphous prior to such amorphizing.

That is, the method of the second embodiment includes amorphizing the surface layer of the semiconductor substrate 20 having a copper line 24 before weakening the surface layer of the semiconductor substrate 20.

For example, in the second embodiment, amorphizing the surface layer of the semiconductor substrate 20 comprises implanting or treating the surface with Ge ions, thereby effectively (and/or simultaneously) weakening and removing the surface layer of the semiconductor substrate 20.

The second embodiment may utilize the processes described above in regard to the first embodiment.

For example, in the second embodiment of the present invention, $H^+$ is generated by ionizing $SiH_4$ or $NH_3$ gas with an Ar plasma at a voltage of 100 to 1000 eV for a period of time of 1 to 2 min, thereby effectively plasma-treating and/or weakening adhesion of the surface layer of the semiconductor substrate 20.

For example, in the second embodiment of the present invention, Ge ions may be generated in an Ar plasma at a voltage of 1000 to 4000 eV for a period of time of 1 to 2 min, and then the surface layer of the semiconductor substrate 20 may be removed, thereby removing the copper remainder 26 and the copper corrosion 25 without damaging the semiconductor substrate 20.

Additionally, in another method for removing the surface of the semiconductor substrate 20, Ge ions may be implanted into the surface of the semiconductor substrate 20 to remove the copper residue.

According to the second embodiment of the present invention, the copper remainder 26 and the copper corrosion 25, which may not be removed by a cleaning process or a Cu CMP process, may be removed by using a plasma process or an ion implantation process, after weakening adhesion of a surface layer of a substrate by an amorphizing or plasma treatment process. Consequently, adhesion of a subsequently-formed upper insulation layer improves and the likelihood that a short circuit may occur between adjacent copper lines by copper residue can be reduced or prevented.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for manufacturing a semiconductor device, the method comprising:
    forming an insulation layer on a bottom structure of a semiconductor substrate;
    forming a trench and a via hole by selectively etching the insulation layer;
    forming a copper layer on an entire surface of the semiconductor substrate until filling the via hole and the trench;
    planarizing the copper layer by chemical mechanical polishing to form a copper line filling the via hole and the trench;
    performing a plasma process to form a plasma-treated surface layer on the semiconductor substrate; and
    removing the plasma-treated surface layer, wherein removing the surface layer of the Semiconductor substrate comprises:
        performing a radio frequency pre-clean process using an Ar plasma, and a Ge ion implantation process.

2. The method according to claim 1, wherein performing the plasma process comprises generating $H^+$ in a remote plasma and reacting the $H^+$ with the surface of the semiconductor substrate.

3. The method according to claim 2, wherein generating the $H^+$ comprises ionizing $SiH_4$ gas with an Ar remote plasma.

4. The method according to claim 3, wherein ionizing the $SiH_4$ gas with the Ar remote plasma is performed at a voltage of 100 to 1000 eV for a length of time of 1 to 2 min.

5. The method according to claim 2, wherein generating the $H^+$ comprises ionizing $NH_3$ gas with an Ar remote plasma.

6. The method according to claim 5, wherein ionizing the $NH_3$ gas with the Ar remote plasma is performed at a voltage of 100 to 1000 eV for a length of time of 1 to 2 min.

7. The method according to claim 1, wherein generating the Ge ion implantation process comprises flowing a Ge-containing gas into an Ar plasma at a voltage of 1000 to 4000 eV for a length of time of 1 to 2 min.

8. A method for manufacturing a semiconductor device, the method comprising:
    forming an insulation layer on a bottom structure of a semiconductor substrate;
    forming a trench and a via hole by selectively etching the insulation layer;
    forming a copper layer on an entire surface of the semiconductor substrate until filling the via hole and the trench;
    planarizing the copper layer by chemical mechanical polishing to form a copper line filling the via hole and the trench;
    performing a plasma process to form a plasma-treated surface layer on the semiconductor substrate; and
    removing the plasma-treated surface layer, wherein removing the surface layer of the semiconductor substrate comprises a Ge ion implantation process.

9. A method for a semiconductor device, the method comprising:
    forming an insulation layer on a bottom structure of a semiconductor substrate;
    forming a trench and a via hole by selectively etching the insulation layer;
    forming a copper layer on an entire surface of the semiconductor substrate until filling the via hole and the trench;
    planarizing the copper layer by a chemical mechanical polishing process to form a copper line filling the via hole and the trench;
    amorphizing a surface layer of the semiconductor substrate having the copper line thereon;
    performing a plasma process to form a plasma-treated, amorphous surface layer; and
    removing the plasma-treated, amorphous surface layer.

10. The method according to claim 9, wherein amorphizing the surface layer of the semiconductor substrate comprises implanting Ge ions.

11. The method according to claim 9, wherein performing the plasma process comprises generating $H^+$ and/or H. in a remote plasma and reacting $H^+$ and/or H. with the surface of the semiconductor substrate having the copper line thereon.

12. The method according to claim 11, wherein generating the $H^+$ and/or H. comprises ionizing $SiH_4$ gas with an Ar remote plasma.

13. The method according to claim 12, wherein the $SiH_4$ gas is ionized with the Ar remote plasma at a voltage of 100 to 1000 eV for a period of time of 1 to 2 min.

14. The method according to claim 11, wherein generating the $H^+$ and/or H. comprises ionizing $NH_3$ gas with an Ar remote plasma.

15. The method according to claim 9, wherein removing the surface layer of the semiconductor substrate comprises performing a radio frequency pre-clean process using an Ar plasma.

16. The method according to claim 15, wherein removing the surface layer of the semiconductor substrate further comprises a Ge ion implantation process.

17. The method according to claim 16, wherein the Ge ion implantation process comprises flowing a Ge-containing gas into an Ar plasma at a voltage of 1000 to 4000 eV for a length of time of 1 to 2 min.

18. The method according to claim 9, wherein removing the surface layer of the semiconductor substrate comprises a Ge ion implantation process.

\* \* \* \* \*